United States Patent
De Weerdt et al.

(10) Patent No.: US 10,859,652 B2
(45) Date of Patent: Dec. 8, 2020

(54) MR IMAGING WITH DIXON-TYPE WATER/FAT SEPARATION

(71) Applicant: KONINKLIJKE PHILIPS N.V., Eindhoven (NL)

(72) Inventors: Elwin De Weerdt, Tilburg (NL); Adriaan Leendert Moerland, Sint-Maartensdijk (NL)

(73) Assignee: Koninklijke Philips N.V., Eindhoven (NL)

(*) Notice: Subject to any disclaimer, the term of this patent is extended or adjusted under 35 U.S.C. 154(b) by 0 days.

(21) Appl. No.: 16/325,439

(22) PCT Filed: Aug. 15, 2017

(86) PCT No.: PCT/EP2017/070674
§ 371 (c)(1),
(2) Date: Feb. 14, 2019

(87) PCT Pub. No.: WO2018/033535
PCT Pub. Date: Feb. 22, 2018

(65) Prior Publication Data
US 2019/0212404 A1 Jul. 11, 2019

(30) Foreign Application Priority Data
Aug. 15, 2016 (EP) .................................. 16184159

(51) Int. Cl.
*G01R 33/48* (2006.01)
*G01R 33/24* (2006.01)
*G01R 33/561* (2006.01)

(52) U.S. Cl.
CPC ....... *G01R 33/4828* (2013.01); *G01R 33/243* (2013.01); *G01R 33/5615* (2013.01)

(58) Field of Classification Search
CPC ............ G01R 33/4828; G01R 33/5615; G01R 33/243
See application file for complete search history.

(56) References Cited

U.S. PATENT DOCUMENTS

2010/0239151 A1* 9/2010 Dannels ............... G01R 33/243
382/131
2011/0140696 A1 6/2011 Yu
(Continued)

FOREIGN PATENT DOCUMENTS

EP 2503348 A1 9/2012
WO 2011139232 A1 11/2011

OTHER PUBLICATIONS

Yu et al "Robust Multipoint Water-Fat Separation Using Fat Likelihood Analysis" Magnetic Resonance in Med. 67 p. 1065-1076 (2012).
(Continued)

*Primary Examiner* — Akm Zakaria

(57) ABSTRACT

A Dixon water/fat separation technique, in particular in combination with a single-point acquisition scheme, avoids swaps of water and fat signals in the reconstructed MR images due to imperfections of the main magnetic field $B_0$. Echo signals are generated and acquired in a pre-scan by subjecting an object (10) to a two or more point imaging sequence. A fat fraction map is derived from the echo signals of the pre-scan. Echo signals are generated and acquired in a clinical scan by subjecting the object (10) to a single-point imaging sequence. A field map estimate is derived from the fat fraction map and from the echo signals of the clinical scan. An MR image is reconstructed from the echo signals of the clinical scan. Signal contributions from fat and water are separated on the basis of the field map estimate.

16 Claims, 2 Drawing Sheets

(56) References Cited

U.S. PATENT DOCUMENTS

| 2011/0254547 | A1  | 10/2011 | Reeder et al. |
| 2012/0176131 | A1  | 7/2012  | Madhuranthakam et al. |
| 2013/0214781 | A1  | 8/2013  | Hernando et al. |
| 2014/0266192 | A1  | 9/2014  | Taviani |
| 2015/0061667 | A1  | 3/2015  | Nickel |
| 2015/0212183 | A1  | 7/2015  | Beck |
| 2016/0313423 | A1  | 10/2016 | Eggers |
| 2017/0102439 | A1* | 4/2017  | McMillan ........ G01R 33/56572 |

OTHER PUBLICATIONS

Xia Dong Zhong et al: "Liver fat quantification using a multi-step adaptive fitting approach with multi-echo GRE imaging",Magnetic Resonance in Medicine, vol. 72, No. 5, Dec. 9, 2013 (Dec. 9, 2013), pp. 1353-1355.

Benjamin Leporq et al: "Quantification of the triglyceride fatty acid composition with 3.07T MRI", NMR in Biomedicine, vol. 27, No. 10, Aug. 14, 2014 (Aug. 14, 2014), pp. 1211-1221.

Samir D. Sharma et al: "Accelerated water-fat imaging using restricted subspace field map estimation and compressed sensing",Magnetic Resonance in Medicine, vol. 67, No. 3, Jun. 28, 2011 (Jun. 28, 2011), pp. 650-659.

D. Hernando et al: "Addressing phase errors in fat-water imaging using a mixed magnitude/complex fitting method",Magnetic Resonance in Medicine, vol. 67, No. 3, Jun. 28, 2011 (Jun. 28, 2011), pp. 638-644.

Reeder SB et al:"Quantification of hepatic steatosis with MRI: The effects of accurate fat spectral modeling", Journal of Magnetic Resonance Imaging, Society for Magnetic Resonance Imaging, Oak Brook, IL, US,vol. 29, No. 6, Jun. 1, 2009 (Jun. 1, 2009), pp. 1332-1339.

Holger Eggers Ft Al: "Dual-Echo Dixon Imaging with Flexible Choice of Echo Times", Magnetic Resonance in Medicine, 2010 Wiley-Liss, Inc, vol. 65, No. 1,Sep. 21, 2010 (Sep. 21, 2010), pp. 96-107.

Jingfei MA: "A Single-Point Dixon Technique for Fat-Suppressed Fast 3D Gradient-Echo Imaging With a Flexible Echo Time", Journal of Magnetic Resonance Imaging, 2008 Wiley-Liss, Inc, vol. 27, No. 4, Feb. 26, 2008 (Feb. 26, 2008), pp. 881-890.

* cited by examiner

MR IMAGING WITH DIXON-TYPE WATER/FAT SEPARATION

CROSS REFERENCE TO RELATED APPLICATIONS

This application is a U.S. national phase application of International Application No. PCT/EP2017/070674, filed on Aug. 15, 2017, which claims the benefit of EP Application Serial No. 16184159.8 filed on Aug. 15, 2016 and is incorporated herein by reference.

FIELD OF THE INVENTION

The invention relates to the field of magnetic resonance (MR) imaging. It concerns a method of MR imaging of a portion of a body placed in the examination volume of a MR device. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system on which the measurement is based. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z-axis to the transverse plane (flip angle 90°).

After termination of the RF pulse, the magnetization relaxes back to the original state of equilibrium, in which the magnetization in the z direction is built up again with a first time constant $T_1$ (spin-lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal in the receiving coils.

In order to realize spatial resolution in the body, constant magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired with different phase encoding. Each k-space line is digitized by collecting a number of samples. A set of k-space data is converted to an MR image, e.g., by means of Fourier transformation.

In MR imaging, it is often desired to obtain information about the relative contribution of water and fat to the overall signal, either to suppress the contribution of one of them or to separately or jointly analyze the contribution of both of them. These contributions can be calculated if information from two or more corresponding echoes, acquired at different echo times, is combined. This may be considered as chemical shift encoding, in which an additional dimension, the chemical shift dimension, is defined and encoded by acquiring two or more MR images at slightly different echo times. For water/fat separation, these types of experiments are often referred to as Dixon-type of measurements. By means of Dixon MR imaging or Dixon water/fat MR imaging, a water/fat separation is achieved by calculating contributions of water and fat from two or more corresponding echoes, acquired at different echo times. In general, such a separation is possible because there is a known precessional frequency difference of hydrogen in fat and water. In its simplest form, water and fat images are generated by either addition or subtraction of the 'in-phase' and 'out-of-phase' datasets.

Several Dixon-type MR imaging methods have been proposed in recent years. Apart from different strategies for the water/fat separation, the known techniques are mainly characterized by the specific number of echoes (or 'points') they acquire and by the constraints that they impose on the used echo times. Conventional so-called two- and three-point methods require in-phase and opposed-phase echo times at which the water and fat signals are parallel and antiparallel in the complex plane, respectively. Three-point methods have gradually been generalized to allow flexible echo times. Thus, they do not restrict the angle or phase between the water and fat signals at the echo times to certain values anymore. In this way, they provide more freedom in imaging sequence design and enable in particular a trade-off between signal-to-noise ratio (SNR) gains from the acquisition and SNR losses in the separation. Sampling only two instead of three echoes is desirable to reduce scan time. However, constraints on the echo times may actually render dual-echo acquisitions slower than triple-echo acquisitions. Eggers et al. (Magnetic Resonance in Medicine, 65, 96-107, 2011) have proposed a dual-echo flexible Dixon-type MR imaging method which enables the elimination of such constraints.

Dixon-type MR imaging methods are often applied in combination with fast (turbo) spin echo sequences using multiple repetition or multiple acquisition approaches. Typically, two or three interleaved measurements with shifted readout magnetic field gradients and acquisition windows are employed.

The main drawback of known two- or multi-point Dixon techniques is that the acquisition of multiple echoes as a prerequisite for the water/fat separation requires long scan times. The minimum scan time is at least doubled when a two-point Dixon technique is applied. A further drawback is their increased sensitivity to motion and their susceptibility to $T_2^*$-effects.

Single-point Dixon techniques in which echo signals are acquired at only a single echo time have been reported in the literature (see, e.g., J. Ma, "A Single-Point Dixon Technique for Fat-Suppressed Fast 3D Gradient-Echo Imaging With a Flexible Echo Time", Journal of Magnetic Resonance Imaging, vol. 27, p. 881-890, 2008). These have several advantages over conventional multi-point techniques: the scan times are considerably shorter, they are not influenced by $T_2^*$-effects, and they are less sensitive to motion.

However, a drawback of the known single-point Dixon techniques is their inherent inability to correctly separate signal contributions from water and fat in regions in which 'mixed' voxels occur. In such mixed voxels signal contributions from both water and fat are present (e.g., in bone tissue where the voxels contain about 65% fat and 35% water contributions). Such voxels will be recognized by the conventional techniques as either pure fat voxels or pure water voxels (depending on which contribution is dominant). This is inacceptable in practice from a radiologist's point of view.

Another disadvantage of earlier reported single point techniques is the chance of so-called water/fat swaps. The retrospective separation of the contributions from the different chemical species to the acquired echo signals relies on a smooth spatial variation of the main magnetic field $B_0$. This general assumption is typically violated near large susceptibility gradients within the examination volume and also at locations remote from the iso-center of the main magnet coil of the used MR device. Such imperfections cause the algorithms conventionally used for the retrospective separation of the signal contributions from the different chemical species to 'swap', with the consequence that signal contributions from fat wrongly appear in the water image and vice versa.

It is further known that prior knowledge about the spatial variation of the main magnetic field (e.g., a separately acquired $B_0$ map) can be used to solve the afore-described issues of single-point Dixon techniques. However, the $B_0$ map has to be very accurate. A sufficient accuracy of the $B_0$ map to ensure a robust water/fat separation is almost impossible to achieve in practice.

SUMMARY OF THE INVENTION

From the foregoing it is readily appreciated that there is a need for an improved MR imaging technique. It is an object of the invention to provide a Dixon water/fat separation technique, in particular in combination with a single-point acquisition scheme, that avoids swaps of water and fat signals in the reconstructed MR images due to imperfections of the main magnetic field $B_0$.

In accordance with the invention, a method of MR imaging comprising the following steps is disclosed:
  generating and acquiring echo signals in a pre-scan by subjecting an object to a first imaging sequence;
  deriving a fat fraction map from the echo signals of the pre-scan;
  generating and acquiring echo signals in a clinical scan by subjecting the object to a second imaging sequence;
  deriving a field map estimate from the fat fraction map and from the echo signals of the clinical scan;
  reconstructing a MR image from the echo signals of the clinical scan, wherein signal contributions from fat and water are separated on the basis of the field map estimate.

The invention addresses the above described limitations of conventional Dixon-type MR techniques. The present invention aims at eliminating the swaps of water and fat signals.

It is an insight of the invention that the above-mentioned problems and drawbacks of conventional single-point Dixon techniques can be overcome under the provision that the fat fraction is known. Hence, according to the invention, the fat fraction map is determined in the pre-scan. The fat fraction is defined as the relative contribution of fat to the total signal (the sum of the water and fat signal contributions) in a given voxel.

The first imaging sequence preferably generates the echo signals of the pre-scan at two or more different echo times, wherein the fat fraction map is derived in the conventional fashion using a two- or multi-point Dixon technique. The second imaging sequences preferably generates the echo signals of the clinical scan at a single echo time, wherein the signal contributions from fat and water are separated using a single-point Dixon technique. In other words, according to a preferred embodiment of the invention, a two- or multi-point Dixon technique is used for the pre-scan while a single-point Dixon technique is used for the clinical scan.

The term 'clinical scan' refers to a regular MR imaging scan from which the MR image is finally reconstructed. The pre-scan, in contrast, does only serve for enabling the deriving of the fat fraction map. No MR image (comprising useful diagnostic information) is reconstructed from the echo signal data of the pre-scan.

Alternatively, the second imaging sequences generates the echo signals of the clinical scan also at two or more different echo times, wherein the signal contributions from fat and water are separated using a two- or multi-point Dixon technique. In this embodiment, a two- or multi-point Dixon technique is used for both the pre-scan and the clinical scan.

The second imaging sequence may be any multi-shot, multi-echo imaging sequence conventionally used for Dixon imaging.

It is a further insight of the invention that the field map estimate can be derived from the fat fraction map and the signal data acquired in the clinical scan. Within the meaning of the invention, the field map reflects the phase shift for each voxel within the field of view, which phase shift is induced by inhomogeneity of the main magnetic field $B_0$, eddy currents or other phase offsets. The field map information is made available according to the invention in regions in which mixed voxels (see above) occur, thus enabling a correct water/fat separation in the step of MR image reconstruction. The field map information excludes any ambiguity in the algorithm used for water/fat separation.

It is yet a further insight of the invention that the fat fraction map only needs to be known on a comparatively coarse spatial grid (e.g., with a voxel size of 5 mm×5 mm×5 mm or even more) which can accurately capture the spatial variations of the main magnetic field (the field map). Hence, in a preferred embodiment of the invention, the spatial resolution of the pre-scan is lower than the spatial resolution of the clinical scan (the voxel size of the MR image reconstructed from the clinical scan data may be 1 mm×1 mm×1 mm or even less). In this case, the field map estimate will also be derived initially at the lower spatial resolution of the pre-scan. The field map estimate can then be computed at the resolution of the clinical scan by interpolation prior to separating the signal contributions from fat and water in the step of reconstructing the MR image. Smoothing can optionally be applied to the field map estimate prior to separating the signal contributions from fat and water in the step of reconstructing the MR image.

The low-resolution pre-scan of the invention can be performed at a very short scan time (between one and five seconds in practice). Hence, the additional scan time caused by the pre-scan is negligible. The pre-scan can be optimized with regard to the echo times such that the probability of water/fat swaps is minimized. This results in a very accurate fat fraction map. On the basis of the accurate fat fraction map, the finally reconstructed MR image will also not comprise any water/fat swaps. The invention utilizes that the probability of an incorrect determination of the fat fraction is significantly smaller (near zero) than the probability of water/fat swaps in conventional Dixon approaches.

In case the pre-scan has a different contrast weighting than the clinical scan, the fat fraction map produced by the pre-scan should to be corrected prior to deriving the field map estimate. This correction can be performed in a straight forward fashion on the basis of the used sequence parameters. The method of the invention described thus far can be carried out by means of a MR device including at least one main magnet coil for generating a steady magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a control unit for controlling the temporal succession of RF pulses and switched magnetic field gradients, and a reconstruction unit for reconstructing MR images from the received MR signals. The method of the invention can be implemented by a corresponding programming of the reconstruction unit and/or the control unit of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
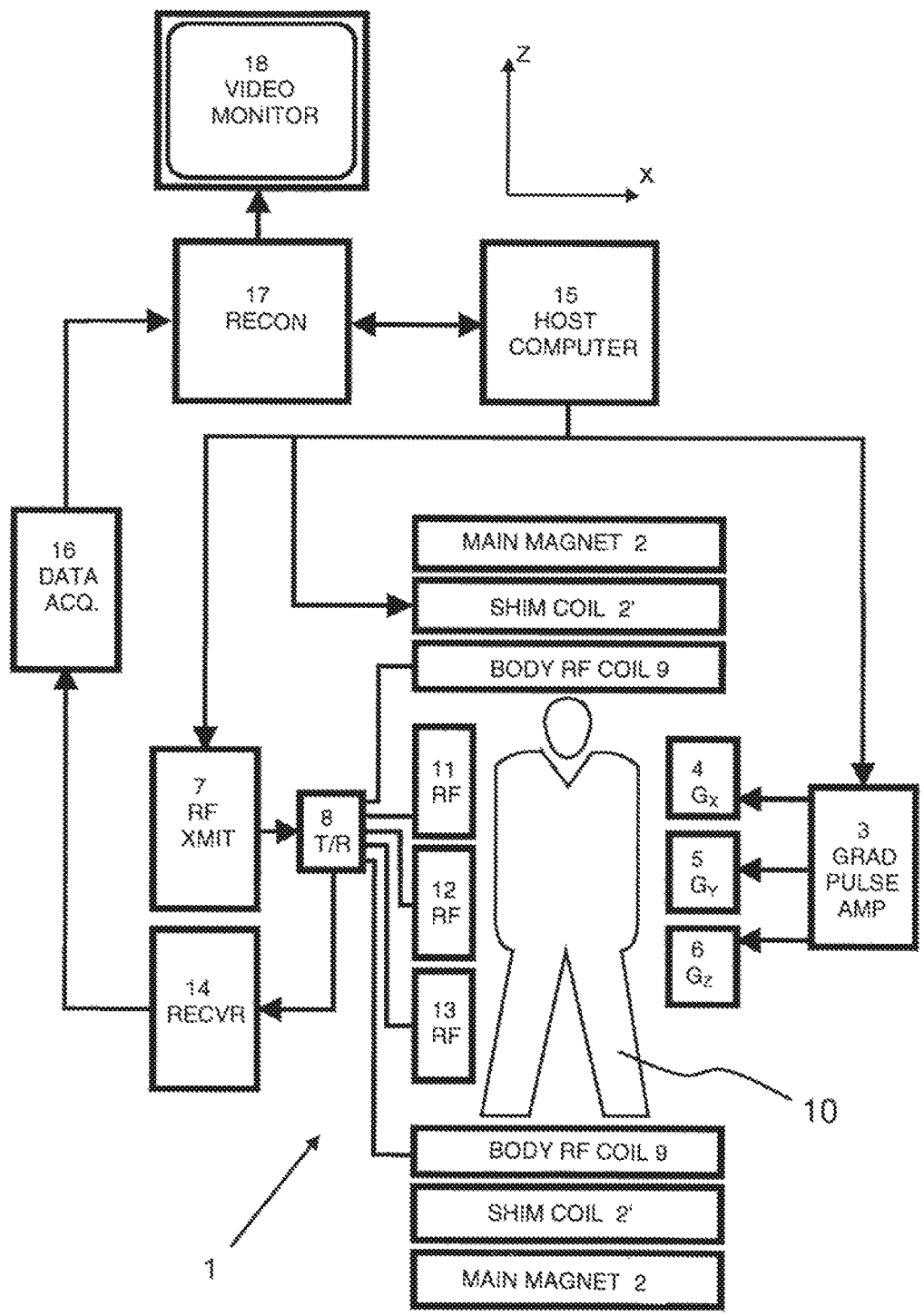
FIG. 1: shows a MR device for carrying out the method of the invention.

With reference to FIG. 1, a MR device 1 is shown. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$, and—where applicable—$3^{rd}$ order) shimming coils 2', wherein the current flow through the individual shimming coils of the set 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10, e.g. by means of parallel imaging, a set of local array RF coils 11, 12, 13 are placed contiguous to the region selected for imaging. The array coils 11, 12, 13 can be used to receive MR signals induced by body-coil RF transmissions.

The resultant MR signals are picked up by the body RF coil 9 and/or by the array RF coils 11, 12, 13 and demodulated by a receiver 14 preferably including a pre-amplifier (not shown). The receiver 14 is connected to the RF coils 9, 11, 12 and 13 via send-/receive switch 8.

A host computer 15 controls the shimming coils 2' as well as the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE or SMASH. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

According to the invention, echo signals are generating and acquired at a low spatial resolution in a pre-scan by application of a first imaging sequence. This first imaging sequence may be any conventional two- or multi-point spin echo or gradient echo sequence, such as, for example, a turbo spin echo sequence using appropriate specific echo times. The voxel size of the pre-scan is 5 mm×5 mm×5 mm or more. The duration of this pre-scan is approximately 5 seconds or less. A fat fraction map is derived from the echo signals of the pre-scan in conventional well-known manner on the coarse grid of the pre-scan. As a next step, a clinical scan is performed at a higher resolution as required for the respective diagnostic task (voxel size 1 mm×1 mm×1 mm or less) by application of a second imaging sequence. The second imaging sequence is a single-echo sequence, as conventionally used for single-point Dixon imaging, in which the echo signals are acquired at only a single specific echo time.

The signals of the clinical scan can be modeled as:

$$s(t) = (w + fc(t))z(t)$$

Wherein $s(t)$ is the measured (complex) signal at time 't' for a given voxel; 'w' denotes the water contribution (real number); 'f' denotes the fat contribution (real number); '$c(t)$' denotes the amplitude and phase of the fat contribution at time 't' relative to the water contribution (complex number). '$c(t)$' is a priori known and is determined by the MR spectrum of the fat protons (the 'spectral model' as conventionally used in Dixon water/fat separation algorithms), and '$z(t)$' is a phasor representing the field map estimate within the meaning of the present invention. '$z(t)$' denotes the phase evolution due to inhomogeneity of the main magnetic field $B_0$ at the given voxel position.

The above formula can be rewritten as:

$$s(t) = w(1 + gc(t))z(t); \quad g = \frac{f}{w}$$

The fat fraction 'FF', which is available for the given voxel from the fat fraction map, is computed as:

$$FF = \frac{f}{w+f} \rightarrow s(t) = f\left(\frac{1-FF}{FF} + c(t)\right)z(t)$$

On this basis, the phase of '$z(t)$' can be calculated as:

$$\arg(z(t)) = \arg\left(\frac{s(t)}{\frac{1-FF}{FF} + c(t)}\right)$$

Because only the phase is needed to compute the fieldmap estimate, the unknowns 'w' or 'f' can be ignored. Hence, the above equations show that the field map estimate is fully defined if the fat fraction map is known.

In case the pre-scan has a different contrast weighting than the clinical scan, the fat fraction map derived from the echo signals of the pre-scan needs to be corrected prior to further processing. In general, given the parameters of the first and second imaging sequences (referred to as 'scan1' and 'scan2' in the following) and the properties of the tissue, one can correct for signal modifications due to $T_1$, $T_2$, $T_2^*$ etc. using the well-known signal equations. In general, the following equation applies to relate the signal from a given tissue in one scan to another:

$$s_{scan2} = s_{scan1} \frac{f(T_1, T_2, T_2^*, \text{sequence parameters } scan2)}{f(T_1, T_2, T_2^*, \text{sequence parameters } scan1)} = s_{scan1} A_{12}$$

Therein the function f depends on the type of sequence and the set of sequence parameters containing, e.g., repetition time, flip angle, inversion time, echo time, etc. The parameter $A_{12}$ denotes the variation in signal between two scans for a given tissue type. The parameter $A_{12}$ can hence be defined for water tissue (w) and for fat tissue (f):

$$w_{scan2} = w_{scan1} A_{12,w}$$

$$f_{scan2} = f_{scan1} A_{12,f}$$

These relations can be used to correct the fat fraction (FF) map:

$$FF_{scan1} = \frac{f_{scan1}}{w_{scan1} + f_{scan1}} = \frac{1}{\frac{w_{scan1}}{f_{scan1}} + 1} = \frac{1}{g_{scan1} + 1} \rightarrow g_{scan1} = \frac{1 - FF_{scan1}}{FF_{scan1}}$$

$$g_{scan2} = \frac{w_{scan2}}{f_{scan2}} = \frac{w_{scan1} A_{12,w}}{f_{scan1} A_{12,f}} = g_{scan1} \frac{A_{12,w}}{A_{12,f}} = g_{scan1} A_{12,g}$$

$$FF_{scan2} = \frac{1}{g_{scan2} + 1} = \frac{1}{g_{scan1} A_{12,g} + 1}$$

$$FF_{scan2} = \frac{1}{\frac{1 - FF_{scan1}}{FF_{scan1}} A_{12,g} + 1} = FF_{scan1} \frac{1}{A_{12,g} + FF_{scan1}(1 - A_{12,g})}$$

Once the corrected fat fraction map $FF_{scan2}$ is obtained, it can be readily used in the further process for water/fat separation as described above.

Figure 2:
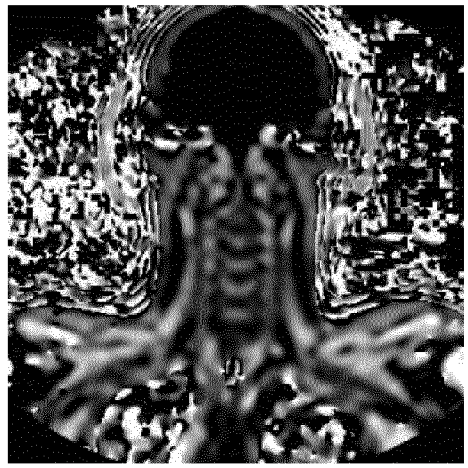
FIG. 2: shows a practical example of a fat fraction map (left) derived from the pre-scan according to the invention, and the corresponding field map estimate (right) on a coarse spatial grid.
Figure 2:
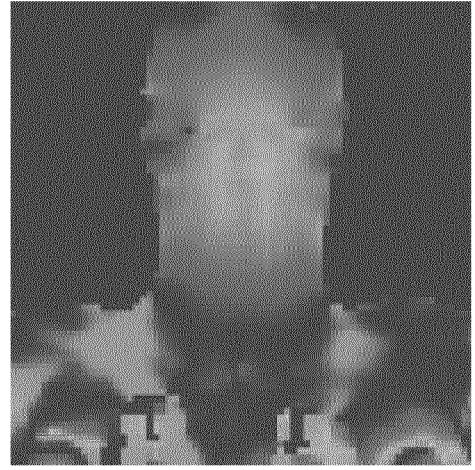

FIG. 2 shows the fat fraction map derived from the pre-scan (left image). The corresponding field map estimate derived as described before is shown in the right image. Both the fat fraction map and the field map estimate are now available on the coarse spatial grid of the pre-scan.

Optionally, spatial smoothing of the field map estimate may be applied before further processing. The field map estimate is required on the finer spatial grid of the clinical scan on which the water/fat separation needs to be performed. This can be achieved simply by interpolation.

For the reconstruction of water and fat MR images, again the above signal model is applied:

$$s(t) = (w + fc(t))z(t)$$

The real numbers 'w' and 'f' can now be derived straight forward as the complex values '$s(t)$' (the measured signal), '$c(t)$' (the spectral model), and also '$z(t)$' (the field map estimate) are known. 'w' and 'f' are obtained by solving the following system of equations:

$$\begin{bmatrix} \mathrm{Re}(s(t)z^*(t)) \\ \mathrm{Im}(s(t)z^*(t)) \end{bmatrix} = \begin{bmatrix} 1 & \mathrm{Re}(c(t)) \\ 0 & \mathrm{Im}(c(t)) \end{bmatrix} \begin{bmatrix} w \\ f \end{bmatrix}$$

The inversion is possible if the fieldmap estimate is known and '$\mathrm{Im}(c(t))$' is not zero. The condition '$\mathrm{Im}(c(t)) = 0$' corresponds to an echo time at which the water and fat contributions are either out of phase or in phase. Hence, the described method based on a single-point acquisition works only works when these two cases do not apply. An in phase echo time or an out of phase echo time should not be used. The closer the acquisition gets to 'Im(c(t))=+/−1', the better the system is conditioned and the better the quality of the water/fat separation will be. 'Im(c(t))=+/−1' corresponds to a partially out of phase and partially in phase echo time.

Figure 3:
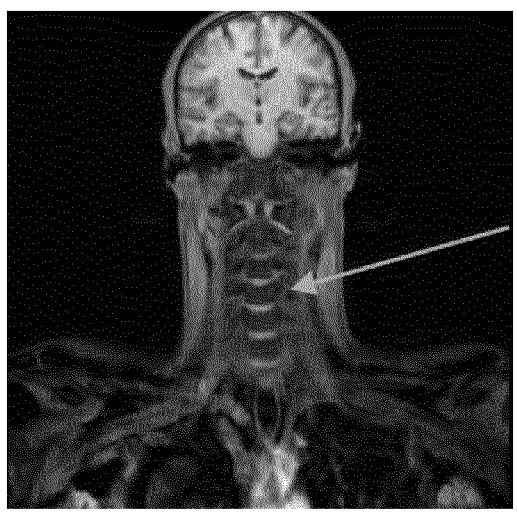
FIG. 3: shows a water image (left) and a fat image (right) reconstructed according to the invention from the clinical scan data and the field map estimate according to the invention.
Figure 3:
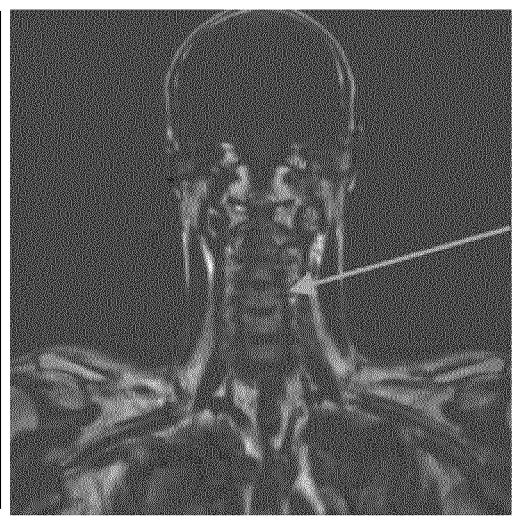

FIG. 3 shows the reconstructed water image (left) at the high resolution of the clinical scan and the corresponding fat image (right). As can be seen, the separation of water and fat is correct in the spine region (arrow) which is known to be a problematic region in conventional single-point Dixon imaging techniques in terms of water/fat swaps.

The invention has been described with reference to the preferred embodiments. Modifications and alterations may occur to others upon reading and understanding the preceding detailed description. It is intended that the invention be constructed as including all such modifications and alterations insofar as they come within the scope of the appended claims or the equivalents thereof.

The invention claimed is:

1. A method of magnetic resonance (MR) imaging, the method comprising:
    generating and acquiring chemical shift encoded echo signals in a pre-scan by subjecting an object to a lower resolution first imaging sequence having two or more different echo times;
    deriving a lower resolution fat fraction map from the echo signals of the pre-scan;
    generating and acquiring echo signals in a clinical scan by subjecting the object to a higher resolution second imaging sequence having a single echo time;
    deriving a field map estimate from the fat fraction map and from the echo signals of the clinical scan; and
    reconstructing a higher resolution MR image from the echo signals of the clinical scan, wherein signal contributions from fat and water to the echo signals of the clinical data are separated using a single-point Dixon technique and on the basis of the field map estimate.

2. The method of claim 1, wherein the fat fraction map is derived using a two- or multi-point Dixon technique.

3. The method of claim 1, wherein the spatial resolution of the pre-scan is lower than the spatial resolution of the clinical scan.

4. The method of claim 1, wherein the field map estimate is derived at the spatial resolution of the pre-scan.

5. The method of claim 4, wherein the field map estimate is computed at the resolution of the clinical scan by interpolation prior to separating the signal contributions from fat and water in the step of reconstructing the MR image.

6. The method of claim 1, wherein smoothing is applied to the field map estimate prior to separating the signal contributions from fat and water in the step of reconstructing the MR image.

7. The method of claim 1, wherein the fat fraction map is corrected for differences in contrast weighting between the pre-scan and the clinical scan, using knowledge of tissue type and sequence parameters of the pre-scan and the clinical scan.

8. A magnetic resonance (MR) device comprising:
    at least one main magnet coil for generating a steady main magnetic field $B_0$ within an examination volume, a number of gradient coils for generating switched magnetic field gradients in different spatial directions within the examination volume, at least one RF coil for generating RF pulses within the examination volume and/or for receiving MR signals from an object positioned in the examination volume, a control unit for controlling the temporal succession of RF pulses and switched magnetic field gradients, and a reconstruction unit for reconstructing MR images from the received MR signals, wherein the MR device is arranged to perform the following steps:
    generating and acquiring chemical shift encoded lower resolution echo signals in a pre-scan by subjecting the object to a first imaging sequence;
    deriving a lower resolution fat fraction map from the lower resolution echo signals of the pre-scan using a two or multi-point Dixon technique;
    generating and acquiring higher resolution echo signals in a clinical scan by subjecting the object to a second imaging sequence;
    deriving a field map estimate from the fat fraction map and from the echo signals of the clinical scan; and
    reconstructing a higher resolution MR image from the echo signals of the clinical scan, wherein signal contributions from fat and water are separated using a single-point Dixon technique and on the basis of the field map estimate.

9. A computer program stored on a non-transitory computer readable medium to be executed on a magnetic resonance (MR) device, wherein the computer program comprises instructions for:
    generating and acquiring chemical shift encoded echo signals in a pre-scan by subjecting an object to a first imaging sequence with two or more echo times;
    deriving a fat fraction map from the echo signals of the pre-scan;
    generating and acquiring echo signals in a clinical scan by subjecting the object to a second imaging sequence with a single echo time;
    deriving a field map estimate from the fat fraction map and from the echo signals of the clinical scan; and
    reconstructing an MR image from the echo signals of the clinical scan, wherein signal contributions from fat and water are separated in the clinical scan using a single point Dixon technique and on the basis of the field map estimate.

10. A method of magnetic resonance (MR) imaging, the method comprising:
    generating and acquiring chemical shift encoded echo signals from a central region of k-space in a pre-scan by subjecting an object to a first imaging sequence with two or more different echo times;
    deriving a lower resolution fat fraction map with a coarse grid from the echo signals of the pre-scan;
    generating and acquiring echo signals in a clinical scan by subjecting the object to a second imaging sequence that generates the echo signals of the clinical scan at a single echo time;
    deriving a field map estimate indicative of a phase shift for each voxel of the coarse grid due to inhomogeneity of the main magnetic field $B_0$ from the fat fraction map and from the echo signals of the clinical scan;
    interpolating the field map to a finer grid;
    separating signal contributions from fat and water to the echo signals of the clinical scan using a single-point Dixon technique; and
    reconstructing a higher resolution MR image with the finer grid from the signal contributions from water and fat and on the basis of the field map estimate.

11. The method of claim 10, wherein the fat fraction map is derived using a two or multi-point Dixon technique.

12. A magnetic resonance (MR) device including:
at least one main magnet coil for generating a steady main magnetic field $B_0$ within an examination volume,
a number of gradient coils for generating switched magnetic field gradients in different spatial directions within the examination volume,
at least one RF coil for generating RF pulses within the examination volume and/or for receiving MR signals from an object positioned in the examination volume, and
one or more computer processors configured to control the gradient coils and the at least one RF coil to carry out the method of claim 10.

13. A computer program stored on a non-transitory computer readable medium to be executed on a magnetic resonance (MR) device, which computer program comprises instructions for controlling the MR device to perform the method of claim 10.

14. A method of magnetic resonance (MR) imaging comprising:
generating at least one of a low resolution fat fraction map and a low resolution water fraction map from signals acquired from a central region of k-space;
in a clinical scan, generating an MR image using MR echo signals acquired from all of k-space using a one-point Dixon technique, the one-point Dixon technique failing to accurately separate relative water and fat contributions in regions with mixed water and fat voxels; and,
during generating the MR image, using the at least one of the fat fraction map and the water fraction map to separate the relative water and fat contributions in the regions with mixed water and fat voxels.

15. The method of claim 14, wherein the at least one of the low resolution fat fraction map and the water fraction map includes using a two- or multi-point Dixon technique.

16. The method of claim 15, further including:
deriving a $B_0$ field map estimate from the at least one of the fat fraction map and the water fraction map and from the MR echo signals of the clinical scan; and
wherein the water and fat contributions are separated using the field map.

* * * * *